United States Patent
Raghavan et al.

[11] Patent Number: 6,162,302
[45] Date of Patent: Dec. 19, 2000

[54] METHOD OF CLEANING QUARTZ SUBSTRATES USING CONDUCTIVE SOLUTIONS

[75] Inventors: Nadipuram V. Vijaya Raghavan, Los Altos; Elaine Lai-Yee Leung, Fremont, both of Calif.

[73] Assignee: Agilent Technologies, Palo Alto, Calif.

[21] Appl. No.: 09/441,716

[22] Filed: Nov. 16, 1999

[51] Int. Cl.[7] .................................................. C23G 1/02
[52] U.S. Cl. ............................. 134/3; 134/2; 134/22.17; 134/22.19; 134/26; 134/27; 134/28; 134/29; 134/34; 134/36; 134/39; 134/40; 134/41; 134/42; 134/902; 510/109; 510/175; 510/254; 510/259; 510/367; 510/435; 510/504
[58] Field of Search .............................. 134/2, 3, 22.17, 134/22.19, 26, 27, 28, 29, 34, 36, 39, 40, 41, 42, 902; 510/175, 109, 254, 259, 367, 435, 504

[56] References Cited

U.S. PATENT DOCUMENTS

| | | | |
|---|---|---|---|
| 4,626,316 | 12/1986 | Brandmayr | 156/637 |
| 4,923,772 | 5/1990 | Kirch et al. | 430/5 |
| 5,259,888 | 11/1993 | McCoy | 134/2 |
| 5,397,430 | 3/1995 | Philippot et al. | 156/662 |
| 5,408,738 | 4/1995 | Schantz et al. | 29/611 |
| 5,470,393 | 11/1995 | Fukazawa | 134/26 |
| 5,489,557 | 2/1996 | Jolley | 156/640.1 |
| 5,637,151 | 6/1997 | Schulz | 134/2 |
| 5,679,171 | 10/1997 | Saga et al. | 134/26 |
| 5,853,491 | 12/1998 | Scholz | 134/2 |
| 5,932,022 | 8/1999 | Linn et al. | 134/2 |
| 5,938,857 | 8/1999 | Fujiwara et al. | 134/2 |

Primary Examiner—Sharidan Carrillo

[57] ABSTRACT

A cleaning method for a quartz substrate includes mixing a rinsing solution and mixing a cleaning solution such that the solutions are electrically conductive. The rinsing solution is carbonated and is used in more than one step within the method. The cleaning solution includes ammonium hydroxide. As a result of the electrical conductivity of the solutions, the cleaning method is less susceptible to surface damage caused by electrostatic discharge. The sequence of steps includes rinsing the quartz substrate with the carbonated rinsing solution, removing loose contaminants by a high pressure application of the cleaning solution, and removing organic contaminants in a strong oxidation environment using a solution of sulfuric acid and hydrogen peroxide. The carbonated rinsing solution is again applied, followed by another high pressure application of the cleaning solution and a final rinse with the carbonated rinsing solution. In the preferred embodiment, the cleaned quartz substrate is used to form a laser ablation mask by depositing dielectric layers that are patterned to define an exposure pattern. In the most preferred embodiment, the laser ablation mask is used in the fabrication of inkjet printheads.

12 Claims, 4 Drawing Sheets

METHOD OF CLEANING QUARTZ SUBSTRATES USING CONDUCTIVE SOLUTIONS

TECHNICAL FIELD

The invention relates generally to methods and systems for fabricating laser ablation masks and the like and relates more particularly to approaches to cleaning quartz substrates.

DESCRIPTION OF THE RELATED ART

Laser ablation is one available technique for forming features on the surface of a component or forming through holes in the component. Selected portions of the surface of the component are exposed to high energy laser radiation that causes chemical breakdown of the bonds within the exposed material. Localized expansion occurs as a result of the breaking of the chemical bonds. The material which has expanded can be removed using conventional techniques, such as chemical etching.

A laser ablation mask is typically employed to control the exposure pattern on the surface of the component. The laser ablation mask utilizes a transparent substrate on which one or more layers can be formed and patterned to provide a coating that defines the exposure pattern. The materials for forming the coating are selected to be resistant to damage as a result of exposure to the laser energy. The substrate and the coating should have a resistance to laser-induced damage during ablation operations in which a laser has a strength greater than 150 $mJ/cm^2$. A suitable substrate material is quartz. The coating on the quartz substrate may be a single metal layer, such as a chromium or aluminum layer. Alternatively, the coating may be formed of multiple dielectric layers having alternating high and low refractive indices. U.S. Pat. No. 4,923,772 to Kirch describes a laser ablation mask that, formed of multiple dielectric layers that are patterned to define the exposure pattern.

FIG. 1 is a schematic representation of the use of laser ablation in the process of forming inkjet printheads. The process is described in greater detail in U.S. Pat. No. 5,408,738 to Schantz et al., which is assigned to the assignee of the present invention. A continuous web 10 of polymer material is removed from a roll 12 in a controlled manner. The web material may be the polymer sold by 3M Corporation under the federally registered trademark KAPTON. Sprocket holes 14 along the opposite sides of the web may be used to precisely control movement of the web material relative to a laser source 16, such as an Excimer laser. While not shown in FIG. 1, the laser source is typically located within a laser processing chamber. One or more laser ablation masks 18 can be patterned to define all of the features that are to be formed within the continuous web 10. The ablation is repeated at a controlled interval, so that duplicate components for an inkjet printhead may be formed from the web, after the web is diced. In FIG. 1, the mask 18 is patterned to define an array of vaporization chambers. In addition to stepping the movement of the continuous web 10, the laser source 16 may be stepped. The step-and-repeat process is continued until a nozzle member is formed. Optics 20 may be used for focusing the laser energy that propagates through the mask 18.

The treated portion of the web then advances to a cleaning station not shown, where any debris is removed from the web. The next station is a bonding station at which heater substrates 22 are secured to the web at positions conforming to the arrays of vaporization chambers. Each heater substrate may be a silicon die on which resistors are formed in an array that matches the array of vaporization chambers, so that there is a one-to-one correspondence between the arrays. The web can then be cut in order to provide individual printheads 24 that are attached to other components to form inkjet cartridges.

Returning to the laser ablation mask 18 that is used in the ablation station, there are a number of equally important mask-fabrication steps. The material of the mask substrate should be selected based upon its optical properties, since the laser energy propagates through the substrate. Quartz is a preferred substrate material. The substrate should be thoroughly cleaned prior to forming the coating on at least one surface of the substrate. The cleaning process removes trace organic layers, such as remnants of the compounds that are used to polish the quartz substrate. Such contaminants may strongly influence the lifetime of the laser ablation mask. The cleaning process will be described in detail below.

The coating is then applied to the substrate. Conventional Physical Vapor Deposition (PVD) techniques may be utilized. PVD processing requires that the substrate be placed in a vacuum chamber and that the chamber be evacuated. Materials are introduced into the vacuum chamber to vapor deposit layers. As previously noted, the coating on the substrate may be a single layer of metal or composite metal, or may be a dielectric stack. The dielectric stack includes layers having alternating high and low indices of refraction. Absorption of laser energy by the mask coating is a major cause of degradation of the mask. Therefore, the mask coating should be reflective to light having the wavelength of the laser energy. Reflection from the dielectric stack is a result of the constructive and destructive interference at the interfaces of abutting layers. Each layer preferably has a thickness of approximately one quarter-wavelength of the laser energy to which it will be exposed. Each pair of dielectric layers reflects a percentage of the incident light. By depositing a sufficient number of layer pairs, nearly all of the laser energy is reflected.

The coating can then be patterned using conventional techniques. For example, reactive ion etching (RIE) or ion beam etching (IBE) maybe employed. While the resulting mask may operate well for its intended purpose, the operational life of the ablation mask is limited. Laser-induced damage to ablation masks is still critically dependent upon the level of coating defect density. That is, the damage that occurs as a result of exposure to the high energy laser radiation will increase with increases in defect density. With each failed mask, time must be taken to replace the mask. The equipment downtime required to replace masks reduces production throughput in an inkjet printhead manufacturing process.

Returning to the description of the process for cleaning the quartz substrate, U.S. Pat. No. 5,259,888 to McCoy, describes the use of a solution of water and quaternary ammonium hydroxide to clean a quartz surface. The temperature and the exposure time are controlled to remove inorganic substances from the quartz surface. A well known approach to cleaning silicon wafers (as compared to quartz substrates) is referred to as a "RCA clean." The process is described in U.S. Pat. No. 5,489,557 to Jolley. The silicon substrate is first exposed to a solution of sulfuric acid and hydrogen peroxide to remove organic contaminants. This is followed by an application of a solution of ammonium hydroxide and hydrogen peroxide. The silicon substrate is then rinsed with deionized water.

In the next step of the RCA clean, the silicon dioxide that was formed in the previous steps is stripped. The oxide stripping solution includes hydrofluoric acid. The hydrofluoric acid is then rinsed from the substrate using deionized water. As noted in the Jolley patent, the rinsed substrate is typically not dried. Instead, the wet substrate is transferred to a solution of hydrochloric acid and hydrogen peroxide. The solution of hydrochloric acid and hydrogen peroxide is intended to dissolve any metals that may exist on the surface of the substrate. While not described in the patent, the final steps of the RCA clean are typically to rinse the substrate with deionized water and spin dry the silicon substrate.

The RCA clean approach works well for silicon wafers. however, the known approaches for cleaning quartz substrates for laser ablation masks and similar applications are less satisfactory. Since impurities on a pre-coated surface of quartz may strongly influence the operational lifetime of a laser ablation mask, as well as the final product quality of the mask, what is needed is a method for efficiently cleaning a quartz substrate that requires a low defect density.

SUMMARY OF THE INVENTION

A cleaning method for a quartz substrate includes carbonating a rinsing solution that is used in more than one step within the method. More-over, a cleaning solution is mixed to include water and ammonium hydroxide, so that the cleaning solution is electrically conductive. As a result of the rinsing solution and the cleaning solution both being electrically conductive, the method is less susceptible to surface damage caused by electrostatic discharge during the cleaning process.

The first step in the cleaning process is preferably a rinse with the rinsing solution. The rinsing solution is carbonated, so that any static charge is dissipated as a result of the conductivity of the solution. The rinsing solution is preferably deionized water that is diluted with $CO_2$ in the range of 1% to 10% by weight. A next step is to remove loose contaminants, such as those that result from settling by airborne contaminants. The cleaning solution is preferably applied in a pressurized state. A pressure of 300 PSI to 1000 PSI is preferred, but not critical. The ammonium hydroxide provides a relatively high conductivity that functions to dissipate any static charge. The next step removes organic contaminants from the surface of the quartz substrate. A strong oxidation environment is formed by applying a solution having hydrogen peroxide. The solution also includes acid, preferably sulfuric acid. An acceptable ratio of sulfuric acid to hydrogen peroxide is 2:1. The carbonated rinsing solution is then applied to the quartz substrate.

The cleaning solution of water and ammonium hydroxide is reapplied in order to neutralize any remnants of the acid. This step also creates a hydrophilic surface, which may be of significant benefit in the subsequent deposition of layers, such as a dielectric stack for a laser ablation mask. The quartz substrate is again rinsed with the carbonated rinsing solution. At this point, the quartz substrate is dried, such as by means of a spin dry step.

The dried quartz substrate then progresses to the next sequence of steps. As previously noted, the preferred embodiment is one in which a dielectric stack is formed and patterned on the surface of the quartz substrate in order to fabricate a laser ablation mask.

An advantage of the invention is that the cleaning process efficiently and thoroughly removes trace organic materials, such as those that are introduced during polishing of the quartz substrate. For example, Cerium compounds may be used in the polishing of a quartz layer prior to the cleaning process. The impurities associated with the polished quartz surface could strongly influence the operational lifetime of a laser ablation mask, if the cleaning process did not remove the impurities. Additionally, because the carbonated rinsing solution and the ammonium hydroxide cleaning solution are electrically conductive, static discharges are dissipated, thereby reducing the likelihood that discharges will cause defects. Laser ablation masks fabricated using a combination of the cleaning process and a dielectric stack deposition process to be described below produced a laser ablation mask which was successfully used in a production environment for inkjet print-heads, with the mask having an operational life of more than six million "shots" of laser energy.

DETAILED DESCRIPTION

Figure 1:
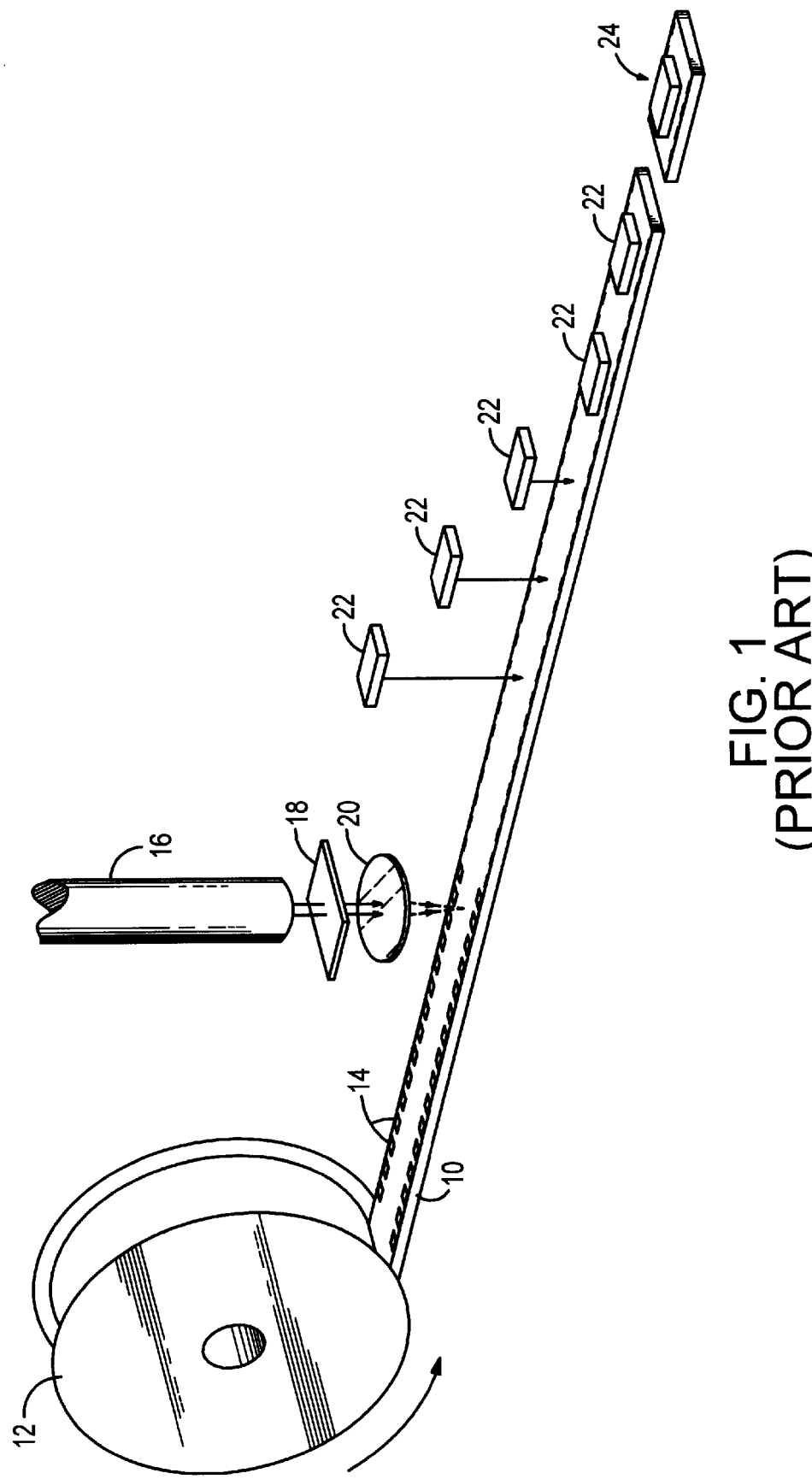
FIG. 1 is a schematic representation of the process for forming inkjet printheads by means of laser ablation, in accordance with the prior art.
Figure 2:
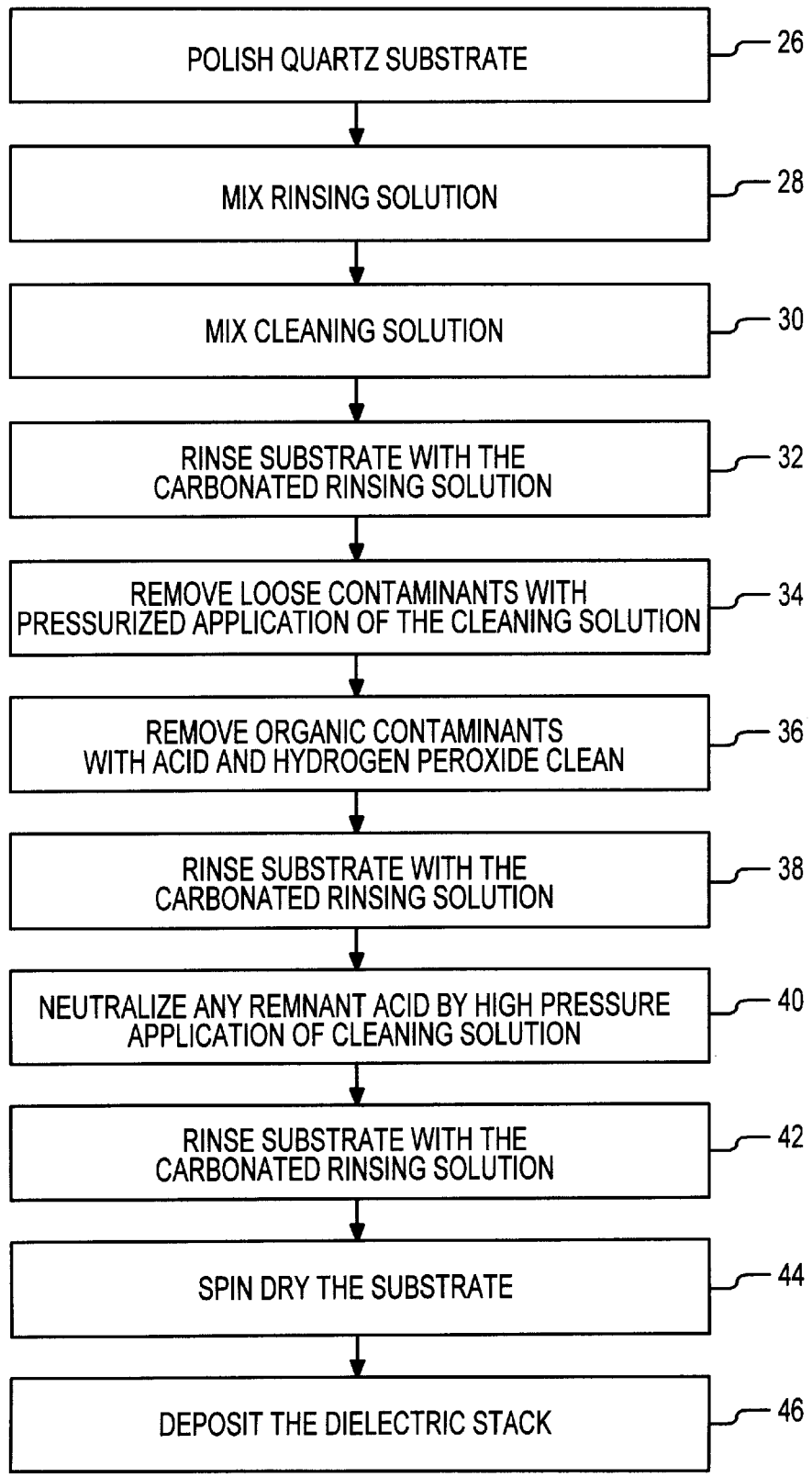
FIG. 2 is a process flow of steps for forming a laser ablation mask in accordance with the invention.

With reference to FIG. 2, the process for preparing a quartz substrate for the deposition of layers on the substrate includes an optional step 26 of polishing the quartz substrate. The polishing step may be implemented using conventional techniques. In the preferred embodiment, the cleaning process to be described below is used to prepare a quartz substrate for application of a dielectric stack that is patterned to define an exposure pattern for fabricating inkjet printheads, as described with reference to FIG. 1.

A rinsing solution is mixed in step 28. The rinsing solution is water having a preselected quantity of carbonation. Preferably, the carbonation is 1% to 10% of the rinsing solution, by weight. The carbonation provides a conductivity that reduces the risk of damage being incurred as a result of static charges generated during the cleaning process.

When measured using a commercially available conductivity meter designed for such measurements, the conductivity of the rinsing solution is preferably in the range of 5K ohms to 50K ohms. The conductivity provides charge dissipation, particularly when the rinsing solution is applied in a manner which achieves complete coverage of the quartz surface being cleaned.

In step 30, a cleaning solution is mixed. The cleaning solution includes water and ammonium hydroxide ($NH_4OH$). In the same manner as the carbonation within the rinsing solution, the ammonium hydroxide provides a level of conductivity that reduces the risk of damage being created by static charges generated during the cleaning process. An acceptable level of ammonium hydroxide within the water base is 0.05% to 3%. While not critical, the ammonium hydroxide may be TEAH (tetra ethyl ammonium hydroxide) or TMAH (tetra methyl ammonium hydroxide). The order of the 30 mixing steps 28 and 30 and the optional polish step 26 is not important to the invention.

A rinsing step 32 exposes the quartz substrate to the rinsing solution. The rinsing technique is not critical, but preferably includes a complete coverage of the substrate surface that is to be cleaned. The complete coverage of the substrate using the carbonated rinsing solution is designed to dissipate any static charges that may have been generated. Known techniques may be utilized to execute step 32, such as providing a five minute rinse within a bubbler rinse device. In step 34, the cleaning solution is applied to the quartz substrate. Preferably, the application is a pressurized application. A pressure within the range of 300 PSI to 1000 PSI is preferred. The cleaning solution removes loose contaminants, such as airborne particles which have settled on the surface of the quartz substrate.

An organic contaminant removal step 36 includes applying acid and hydrogen peroxide to the quartz substrate. The hydrogen peroxide creates a strong oxidation environment that facilitates removal of the organic contaminants. The acid is preferably sulfuric acid, but other acids may be employed. This step removes trace organic materials, such as those that are introduced during the polishing step 26. Polishing compounds, such as Cerium compounds, are often used in the polishing of a quartz substrate or quartz layer. If not removed, these impurities strongly influence the operational life of laser ablation masks. Moreover, the impurities create defects that adversely affect the final product quality, such as the quality of the inkjet printheads that are fabricated during the laser ablation process. The solution that is used in step 36 may be two parts sulfuric acid to one part hydrogen peroxide. The solution is allowed to flow over the surface of the quartz substrate.

A rinsing step 38 is used to wash away the solution that is used in step 36. The carbonated rinsing solution that was mixed in step 28 is utilized. Again, the preferred application is one in which the surface of the quartz substrate is completely covered in order to reduce the risk of damage resulting from any static charges.

The remnants of any acid from step 36 are neutralized in step 40. The cleaning solution from step 30 is applied at high pressure to remove and neutralize remnant acid. This step also creates a hydrophilic surface, which is advantageous in subsequent layer deposition steps.

The quartz substrate is again rinsed at step 42, using the carbonated rinsing solution. This step may be a duplication of rinsing steps 32 and 38. Subsequently, the substrate is dried at step 44. Known drying techniques may be employed, such as spin drying.

The steps 26–44 prepare the quartz substrate for deposition of one or more layers, as indicated at step 46. The deposition of a dielectric stack will be described with reference to FIGS. 3 and 4.

Figure 3:
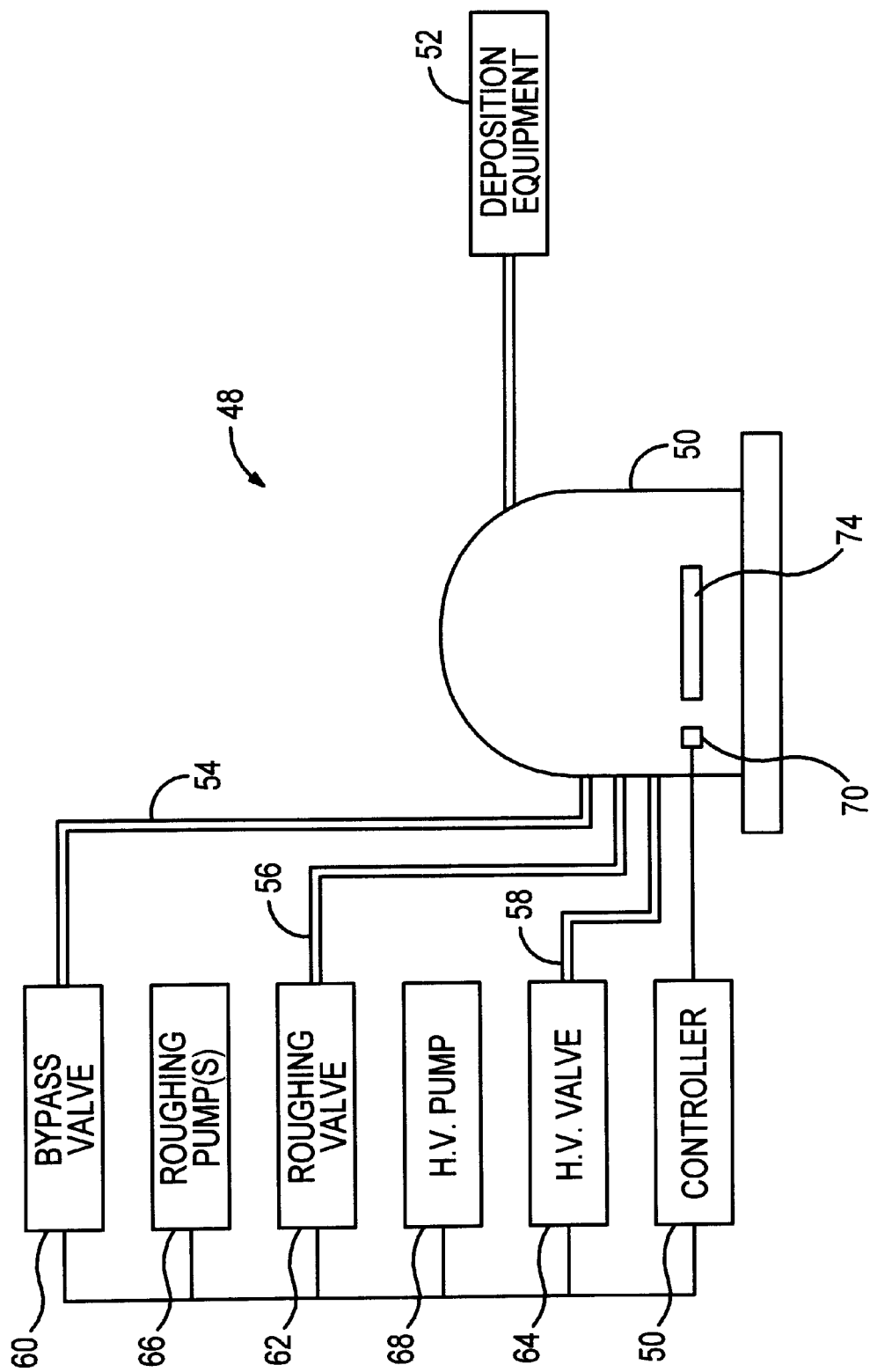
FIG. 3 is a block diagram of components for vapor depositing layers on a quartz substrate that has been cleaned using the method of FIG. 2.

With reference to FIG. 3, a system 48 for fabricating a laser ablation mask for the inkjet printhead industry is shown as including a vacuum chamber 50. While the system will be described as being designed for Physical Vapor Deposition (PVD) processing, the chamber evacuation techniques and the layer fabrication techniques are applicable to other processes.

One connection to the vacuum chamber 50 is a link to deposition equipment 52. Equipment that is presently available may be employed. There are also three evacuation connections 54, 56 and 58 to the vacuum chamber. As will be described more fully below, the three evacuation connections are independently activated and deactivated to provide multi-stage purging of the chamber. Each of the connections includes a valve 60, 62 10 and 64. The bypass valve 60 to the first evacuation connection 54 is initially activated. The main roughing valve 62 is then activated after the pressure within the chamber 50 reaches a preselected setpoint. The maximum rate of evacuation of the first connection 54 is less than the maximum evacuation rate of the second connection 56. Thus, the initial stage of the roughing process will generate less turbulence than if the second connection 56 were to be used at the initial stage. Since the chamber is more susceptible to turbulence-induced adverse effects at the start of evacuation, the reduced capacity of the first connection can be selected to achieve a lower defect density for laser ablation masks. In one implementation, the second evacuation connection 56 has an opening that is consistent with conventional roughing evacuation, while the first connection 54 has an opening that is unconventionally small.

The bypass valve 60 and the roughing valve 62 are shown as being linked to one or more roughing pumps 66. In one embodiment, the valves are connected to separate pumps. However, in the preferred embodiment, the valves are linked to the same pump, thereby reducing the expense of the system 48. The roughing pump may be a conventional mechanical pump used in known PVD systems.

The third evacuation connection 58 is linked to the high vacuum valve 64, which is linked to a high vacuum pump 68. The valve and the pump may be conventional devices. For example, the high vacuum pump may be a diffusion pump, but cryogenic or turbomolecular pumps may be employed. The third connection 58 is activated after the first and second connections 54 and 56 reduce the pressure within the chamber 50 to a second activation setpoint. The roughing process evacuates the chamber to low vacuum, while the diffusion pump is able to decrease the chamber pressure to a high vacuum condition. A suitable pressure setpoint for activation of the high vacuum valve 64 is 150 mTorr.

Pressure within the chamber 50 may be monitored using a Pirani gauge 70. However, other known monitoring devices may be used. The gauge 70 is connected to a controller 72 that regulates the activation of the three valves 60, 62 and 64. The controller includes switching circuitry and may also include the signal processing circuitry for determining chamber pressure based upon signals from the gauge 70. The switching circuitry may be implemented in an embodiment that allows an overlap in the pressure ranges for activating the three connections 54, 56 and 58. Alternatively, the implementation may be one in which the three ranges are mutually exclusive.

Figure 4:
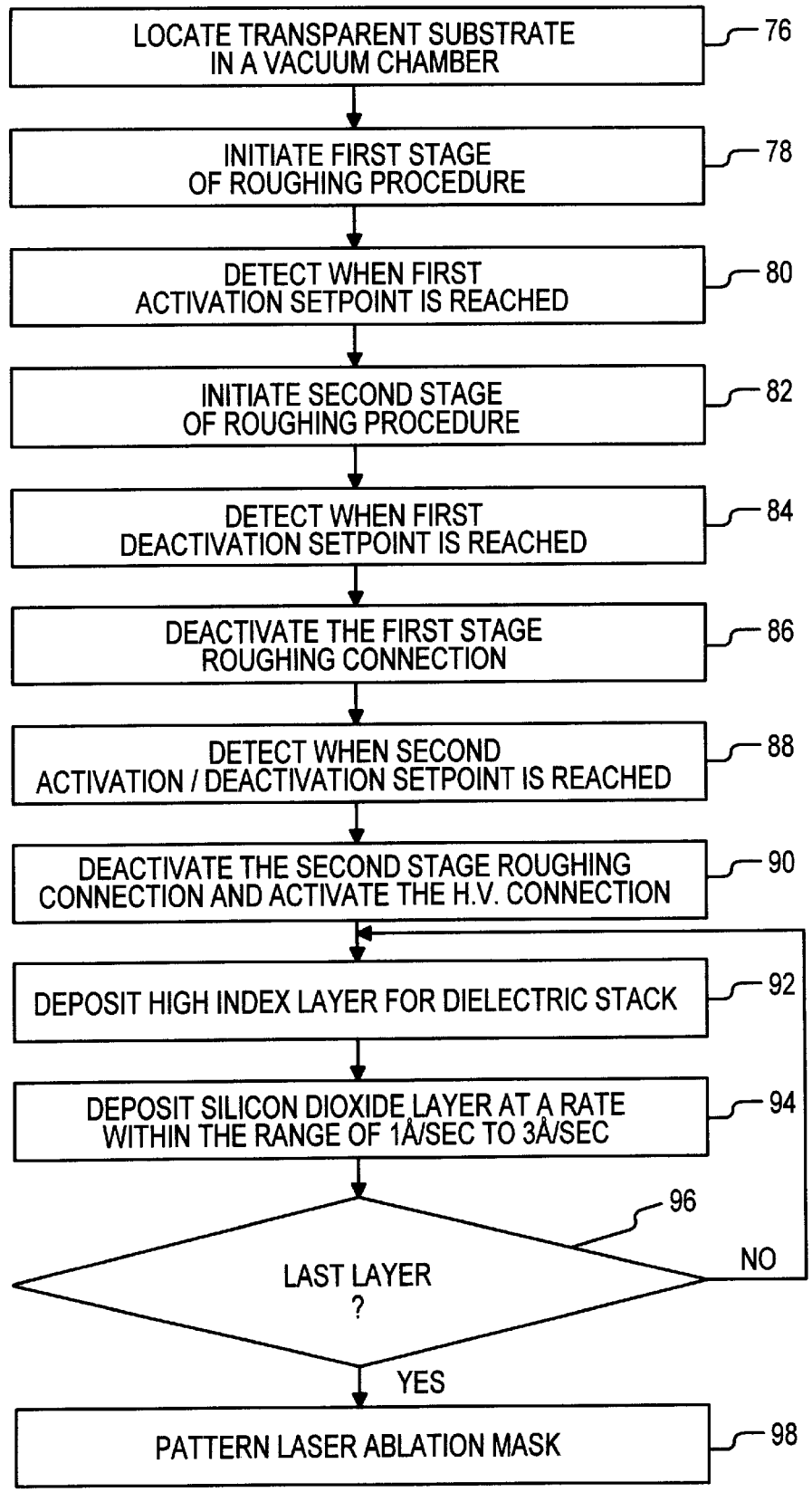
FIG. 4 is a process flow of steps for depositing a dielectric stack on the substrate of FIG. 3.

FIG. 4 is a process flow of steps for forming a laser ablation mask that can be used in the system of FIG. 1 for forming inkjet printheads. The initial step 76 is to locate a transparent substrate 74 in the vacuum chamber 50 of FIG. 3. The substrate is preferably formed of quartz, but other substrate materials (e.g., silica) are known for forming laser ablation masks. In step 78, the first stage of the roughing procedure is initiated. In FIG. 3, the first roughing evacuation connection 54 is activated to begin the purging of the vacuum chamber 50. The bypass valve has a relatively low maximum rate of evacuation, so that turbulence within the chamber is controlled. Consequently, an advantage of the use of the bypass valve is that the system is less susceptible to the occurrences of particulate matter and/or water coming to rest on the surface of the substrate. The introduction of contamination or liquid on the surface of the substrate increases the density of defects, thereby decreasing the operational life of the laser ablation mask. On the other hand, a concern with the use of the unconventionally slow first connection is that the time required to fabricate the laser ablation mask will be extended significantly. Therefore, the second stage of the roughing procedure is utilized.

In step 80, the process of monitoring the pressure within the vacuum chamber results in the detection that the first activation setpoint is reached. At this pressure, the second evacuation connection 56 is activated by operation of the main roughing valve 62, as indicated at step 82. The higher rate second evacuation connection 56 decreases the time required for the roughing procedure.

In the non-overlapping embodiment of a controller, the detection of the first activation setpoint and the initiation of the second stage of the roughing procedure (i.e., steps 80 and 82) coincide with deactivating the-first connection 54. However, in the range-overlapping embodiment, the activation ranges of the first and second connections 54 and 56 overlap. This overlapping embodiment requires the additional steps 84 and 86 of detecting when the first deactivation setpoint is reached and deactivating the first connection 54.

In step 88, the second activation/deactivation setpoint is reached. This triggers the deactivation of the second evacuation connection 56. Simultaneously, the high vacuum connection 58 is activated at step 90. When the pressure within the vacuum chamber reaches the appropriate level, the deposition process begins. Optionally, an adhesion layer or a lift-off patterned masking layer may be applied to the substrate prior to the dielectric stack, as is known in the art. However, layers of greatest concern to the invention are the layers that are used to form the dielectric stack. The dielectric stack is an alternating pattern of high refractive index material and low refractive index material. Table 1 is one embodiment of a dielectric stack. The high refractive index material (H) may be $HfO_2$, while the low refractive index layer material (L) is preferably $SiO_2$. Measurements of layer thickness were based upon a Sycon rate controller. The coating temperature was 275° C. and the oxygen partial pressure was 1.0E-4 Torr for all materials. The resulting coating was an eighteen-layer stack that was highly reflective at 248 nm and normal incidence on a quartz substrate.

TABLE 1

| Layer Number | Layer Material | Layer Thickness |
| --- | --- | --- |
| 1 | H | .831KÅ |
| 2 | L | .307KÅ |
| 3 | H | .831KÅ |
| 4 | L | .307KÅ |
| 5 | H | .831KÅ |
| 6 | L | .307KÅ |
| 7 | H | .831KÅ |
| 8 | L | .307KÅ |
| 9 | H | .831KÅ |
| 10 | L | .307KÅ |
| 11 | H | .831KÅ |
| 12 | L | .307KÅ |
| 13 | H | .831KÅ |
| 14 | L | .307KÅ |
| 15 | H | .831KÅ |
| 16 | L | .307KÅ |
| 17 | H | .831KÅ |
| 18 | L | .614KÅ |

In step 92 of FIG. 4, a first high index layer (H) was deposited. The deposition rate for forming the eighteen-layer stack of Table 1 was 2.0 Å/second, using 3.0 grams/cubic centimeter (g/cc) for $HfO_2$. The deposition rate of the high refractive index layers is less important than the deposition rate of the $SiO_2$.

In step 94, the first $SiO_2$ layer of the stack was formed. The optimal deposition rate is 1 Å/second to 3 Å/sec. Because of the inherent fluctuations in the deposition rate, the preferred practical range is 1.6 Å/second to 2.4 Å/sec. Ideally, the deposition rate is approximately 2.0 Å/sec. A deposition rate above the optimal range defines a process that is susceptible to a high coating defect density. On the other hand, a deposition rate below the range may result in poor adhesion of an $SiO_2$ layer to an adjacent layer.

The decision step 96 is one in which it is determined whether the layer that was deposited at step 94 is the final layer in the dielectric stack. If the stack has not been completed, the process loops back to steps 92 and 94 to form another layer pair. When an affirmative response is generated at the decision step 96, the process advances to the step 98 of patterning the laser ablation mask to form the desired exposure pattern. In the preferred embodiment, the exposure pattern is designed for fabrication of inkjet printheads, as described with reference to FIG. 1.

What is claimed is:

1. A method of cleaning a quartz substrate by removing contaminants from said quart substrate, the method comprising the sequential steps of:
   (a) contacting said quartz substrate with a conductive solution that includes water and ammonium hydroxide;
   (b) treating said quartz substrate with a solution that includes hydrogen peroxide and an acid;
   (c) rinsing said treated quartz substrate with a rinse solution containing carbonated water;
   (d) contacting said quartz substrate with a conductive solution that includes water and ammonium hydroxide; and
   (e) re-rinsing said quartz substrate with a rinse solution containing carbonated water,
   wherein said steps (a) to (e) remove contaminants from said quartz substrate.

2. The method of claim 1 wherein said steps of (c) rinsing and (e) re-rinsing said quartz substrate each include diluting $CO_2$ in deionized water such that said $CO_2$ is in the range of 1% to 10% by weight within said rinse solution.

3. The method of claim 1 further comprising a step of rinsing said quartz substrate with a rinse solution contain carbonated water prior to said step (a) of contacting said quartz substrate with said conductive solution.

4. The method of claim 1 wherein said steps (a) and (d) include providing a pressurized flow of said conductive solution along a surface of said quartz substrate.

5. The method of claim 1 wherein said step (b) of treating said quartz substrate includes forming an aqueous solution of sulfuric acid and hydrogen peroxide.

6. The method of claim 1 further comprising a step of spin drying said quartz substrate following said step (e) of re-rinsing said quartz substrate.

7. The method of claim 1 further comprising a step of forming a patterned laser ablation mask on said quartz substrate following step (e).

8. The method of claim 4 wherein said step of providing said pressurized flow further includes establishing a pressurization in the range of 300 to 1000 pounds per square inch.

9. The method of claim 5 wherein said step of forming said aqueous solution includes providing a ratio of 2:1 of said sulfuric acid to said hydrogen peroxide.

10. A method of cleaning a quartz substrate by removing contaminants from said quartz substrate, the Method comprising the sequential steps of:
    (a) rinsing a surface of said quartz substrate with a rinse solution containing carbonated water;
    (b) cleaning said surface with a pressurized conductive aqueous solution having ammonium hydroxide;
    (c) removing organic contaminants from said surface using a solution that includes an acid and hydrogen peroxide;

(d) rinsing said surface with said rinse solution;
(e) cleaning said surface with said pressurized conductive aqueous solution;
(f) rinsing said surface with said rinse solution; and
(g) drying said quartz substrate.

11. The method of claim 10 wherein said rinse solution is prepared by diluting $CO_2$ in deionized water such that said $CO_2$ is in the range of 1% to 10%, by weight within said rinse solution.

12. The method of claim 10 wherein said solution of step (c) comprises two parts sulfuric acid to one part hydrogen peroxide.

* * * * *